US011710945B2

(12) United States Patent
Alnahhas et al.

(10) Patent No.: US 11,710,945 B2
(45) Date of Patent: Jul. 25, 2023

(54) PROJECTION OF PATTERNED AND FLOOD ILLUMINATION (71) Applicant: Apple Inc., Cupertino, CA (US)

(72) Inventors: Yazan Z. Alnahhas, Mountain View, CA (US); Harish Govindarajan, San Jose, CA (US); Oyvind Svensen, San Jose, CA (US); Yuval Tsur, Tel Aviv (IL); Zhengyu Miao, San Jose, CA (US); Christopher M. Wright, Santa Cruz, CA (US)

(73) Assignee: APPLE INC., Cupertino, CA (US)

( * ) Notice: Subject to any disclaimer, the term of this patent is extended or adjusted under 35 U.S.C. 154(b) by 214 days.

(21) Appl. No.: 17/223,047

(22) Filed: Apr. 6, 2021

(65) Prior Publication Data
US 2021/0364902 A1 Nov. 25, 2021

Related U.S. Application Data (60) Provisional application No. 63/105,361, filed on Oct. 26, 2020, provisional application No. 63/029,499, filed on May 24, 2020.

(51) Int. Cl.
H01S 5/42 (2006.01)
G01B 11/25 (2006.01)

(52) U.S. Cl.
CPC ............ *H01S 5/423* (2013.01); *G01B 11/254* (2013.01)

(58) Field of Classification Search
CPC .. H01S 5/423; H01S 5/02253; H01S 5/02469; H01S 5/0071; H01S 5/02476; G01B 11/254; G01B 11/22
See application file for complete search history.

(56) References Cited

U.S. PATENT DOCUMENTS

| 4,069,463 A | 1/1978 | McGroddy et al. |
| 5,812,571 A | 9/1998 | Peters |
| 6,156,980 A | 12/2000 | Peugh et al. |

(Continued)

FOREIGN PATENT DOCUMENTS

| CN | 205123806 U | 3/2016 |
| CN | 107219711 A | 9/2017 |

(Continued)

OTHER PUBLICATIONS

IN Application # 202114022832 Office Action dated Feb. 24, 2022.

(Continued)

*Primary Examiner* — Tarifur R Chowdhury
*Assistant Examiner* — Akbar Hassan Rizvi
(74) *Attorney, Agent, or Firm* — Kligler & Associates Patent Attorneys Ltd (57) ABSTRACT An optoelectronic apparatus includes a heat sink, which is shaped to define a base, a first platform at a first elevation above the base, and a second platform alongside the first platform at a second elevation above the base, which is different from the first elevation. A first monolithic emitter array is mounted on the first platform and is configured to emit first optical beams. A second monolithic emitter array is mounted on the second platform and is configured to emit second optical beams. An optical element is configured to direct both the first and the second optical beams toward a target region.

18 Claims, 8 Drawing Sheets (56) References Cited

U.S. PATENT DOCUMENTS

| | | |
|---|---|---|
| 6,597,713 B2 | 7/2003 | Ouchi |
| 6,625,028 B1 | 9/2003 | Dove et al. |
| 6,674,948 B2 | 1/2004 | Yeh et al. |
| 6,936,855 B1 | 8/2005 | Harrah |
| 7,126,218 B1 | 10/2006 | Darveaux et al. |
| 7,271,461 B2 | 9/2007 | Dutta |
| 7,303,005 B2 | 12/2007 | Reis et al. |
| 7,800,067 B1 | 9/2010 | Rajavel et al. |
| 7,949,024 B2 | 5/2011 | Joseph |
| 8,050,461 B2 | 11/2011 | Shpunt et al. |
| 8,193,482 B2 | 6/2012 | Itsler |
| 8,259,293 B2 | 9/2012 | Andreou |
| 8,275,270 B2 | 9/2012 | Shushakov et al. |
| 8,350,847 B2 | 1/2013 | Shpunt |
| 8,355,117 B2 | 1/2013 | Niclass |
| 8,405,020 B2 | 3/2013 | Menge |
| 8,604,603 B2 | 12/2013 | Lau et al. |
| 8,761,495 B2 | 6/2014 | Freedman et al. |
| 8,766,164 B2 | 7/2014 | Sanfilippo et al. |
| 8,963,069 B2 | 2/2015 | Drader et al. |
| 9,024,246 B2 | 5/2015 | Jiang et al. |
| 9,052,356 B2 | 6/2015 | Chu et al. |
| 9,076,707 B2 | 7/2015 | Harmon |
| 9,106,849 B2 | 8/2015 | Duggal et al. |
| 9,430,006 B1 | 8/2016 | Hayashida |
| 9,735,539 B2 | 8/2017 | Jiang et al. |
| 9,819,144 B2 | 11/2017 | Lin et al. |
| 9,826,131 B2 | 11/2017 | Alasirnio et al. |
| 10,034,375 B2 | 7/2018 | Pyper et al. |
| 10,103,512 B2 | 10/2018 | Jiang et al. |
| 10,375,330 B2 | 8/2019 | Rephaeli et al. |
| 10,401,480 B1 | 9/2019 | Gaalema et al. |
| 10,454,241 B2 | 10/2019 | Jiang et al. |
| 10,470,307 B2 | 11/2019 | Pyper et al. |
| 10,551,886 B1 | 2/2020 | de la Fuente |
| 10,881,028 B1 | 12/2020 | Huang et al. |
| 11,296,136 B2 | 4/2022 | Nagai et al. |
| 2002/0070443 A1 | 6/2002 | Mu et al. |
| 2002/0127752 A1 | 9/2002 | Thompson et al. |
| 2002/0176459 A1 | 11/2002 | Martinsen |
| 2003/0081385 A1 | 5/2003 | Mochizuki et al. |
| 2004/0001317 A1 | 1/2004 | Getz, Jr. et al. |
| 2004/0180470 A1 | 9/2004 | Romano et al. |
| 2007/0262441 A1 | 11/2007 | Chen |
| 2008/0106746 A1* | 5/2008 | Shpunt ............... G06T 7/521 356/610 |
| 2010/0164079 A1 | 7/2010 | Dekker et al. |
| 2010/0208132 A1 | 8/2010 | Shiraishi |
| 2011/0026264 A1 | 2/2011 | Reed et al. |
| 2011/0278629 A1* | 11/2011 | McDaniel ............ F21V 29/00 257/E33.075 |
| 2012/0002293 A1* | 1/2012 | Du ................... H01S 5/02326 359/629 |
| 2012/0051384 A1 | 3/2012 | Geske et al. |
| 2013/0015331 A1 | 1/2013 | Birk et al. |
| 2013/0163627 A1 | 6/2013 | Seurin |
| 2013/0342835 A1 | 12/2013 | Blaksberg |
| 2014/0231630 A1 | 8/2014 | Rae et al. |
| 2014/0348192 A1 | 11/2014 | Prujimboom et al. |
| 2014/0353471 A1 | 12/2014 | Raynor et al. |
| 2015/0092802 A1 | 4/2015 | Gronenbor et al. |
| 2015/0163429 A1 | 6/2015 | Dai et al. |
| 2015/0195956 A1 | 7/2015 | Linderman |
| 2015/0200222 A1 | 7/2015 | Webster |
| 2015/0200314 A1 | 7/2015 | Webster |
| 2015/0255955 A1 | 9/2015 | Wang et al. |
| 2015/0340841 A1 | 11/2015 | Joseph |
| 2015/0342023 A1 | 11/2015 | Refai-Ahmed et al. |
| 2015/0348865 A1 | 12/2015 | Vincent et al. |
| 2016/0300825 A1 | 10/2016 | Hoeppel |
| 2017/0025815 A1* | 1/2017 | Jiang .................. H01S 5/423 |
| 2017/0170219 A1 | 6/2017 | Iwafuchi et al. |
| 2018/0092241 A1 | 3/2018 | Rasmussen et al. |
| 2018/0092253 A1 | 3/2018 | Qiu et al. |
| 2018/0239105 A1 | 8/2018 | Lee et al. |
| 2018/0310407 A1 | 10/2018 | Pyper et al. |
| 2019/0129035 A1 | 5/2019 | Valouch et al. |
| 2019/0264890 A1 | 8/2019 | Chang et al. |
| 2019/0268068 A1* | 8/2019 | Dacha .................. G02B 5/02 |
| 2019/0295264 A1* | 9/2019 | Petilli ................. G06T 7/285 |
| 2019/0324223 A1 | 10/2019 | Yim et al. |
| 2019/0326731 A1 | 10/2019 | Mathai et al. |
| 2019/0348819 A1* | 11/2019 | Laflaquiere .......... H01L 27/156 |
| 2019/0381939 A1 | 12/2019 | Rafalowski et al. |
| 2020/0096639 A1 | 3/2020 | Panas et al. |
| 2020/0388640 A1 | 12/2020 | Yu et al. |

FOREIGN PATENT DOCUMENTS

| | | |
|---|---|---|
| CN | 110867724 A | 3/2020 |
| CN | 210224593 U | 3/2020 |
| EP | 0949728 A1 | 10/1999 |
| WO | 2018132521 A1 | 7/2018 |
| WO | 2019149778 A1 | 8/2019 |
| WO | 2020026616 A1 | 2/2020 |
| WO | 2020039086 A1 | 2/2020 |
| WO | 2020074351 A1 | 4/2020 |

OTHER PUBLICATIONS

Alnahhas, U.S. Appl. No. 17/013,599, filed Sep. 6, 2020.
Alnahhas et al., U.S. Appl. No. 17/221,856, filed Apr. 5, 2021.
EP Application # 21169425.2 Search Report dated Sep. 24, 2021.
U.S. Appl. No. 17/013,599 Office Action dated Dec. 13, 2022.

* cited by examiner

PROJECTION OF PATTERNED AND FLOOD ILLUMINATION

CROSS-REFERENCE TO RELATED APPLICATIONS

This application claims the benefit of U.S. Provisional Patent Application 63/029,499, filed May 24, 2020, and U.S. Provisional Patent Application 63/105,361, filed Oct. 26, 2020, which are incorporated herein by reference.

FIELD OF THE INVENTION

The present invention relates generally to optoelectronic devices, and particularly to sources of optical radiation.

BACKGROUND

Various sorts of portable computing devices (referred to collectively as "portable devices" in the description), such as smartphones, augmented reality (AR) devices, virtual reality (VR) devices, smart watches, and smart glasses, comprise compact sources of optical radiation. (The terms "optical rays," "optical radiation," and "light," as used in the present description and in the claims, refer generally to any and all of visible, infrared, and ultraviolet radiation.) For example, one source may emit flood radiation, illuminating a target region with a broad and uniform illumination for the purpose of feature illumination and recognition. Another source may, for example, project patterned radiation so as to illuminate the target region with a pattern of dots for three-dimensional (3D) mapping of the region. Effective heat dissipation is one of the major challenges in design of high-power optoelectronic emitters, such as vertical-cavity surface-emitting lasers (VCSELs). Such devices generate large amounts of heat in the emitter active regions, resulting in high emitter junction temperatures, which tend to reduce VCSEL efficiency and lead to a reduced optical power output at a given drive current, shift the emission wavelength, degrade the quality of the laser modes, and reduce operating lifetime and reliability. In VCSEL array devices, inefficient heat dissipation causes temperature non-uniformity among emitters, leading to variations in emitter optical power and wavelength across the array.

In response to this problem, U.S. Pat. No. 9,735,539, whose disclosure is incorporated herein by reference, describes an optoelectronic device, which includes a semiconductor substrate, having front and back sides and having at least one cavity extending from the back side through the semiconductor substrate into proximity with the front side. At least one optoelectronic emitter is formed on the front side of the semiconductor substrate in proximity with the at least one cavity. A heat-conducting material at least partially fills the at least one cavity and is configured to serve as a heat sink for the at least one optoelectronic emitter.

SUMMARY

Embodiments of the present invention that are described hereinbelow provide improved designs and methods of fabrication of sources of optical radiation.

There is therefore provided, in accordance with an embodiment of the invention, optoelectronic apparatus, including a heat sink, which is shaped to define a base, a first platform at a first elevation above the base, and a second platform alongside the first platform at a second elevation above the base, which is different from the first elevation. A first monolithic emitter array is mounted on the first platform and is configured to emit first optical beams. A second monolithic emitter array is mounted on the second platform and is configured to emit second optical beams. An optical element is configured to direct both the first and the second optical beams toward a target region.

In one embodiment, the heat sink includes a metal. Additionally or alternatively, the heat sink includes a ceramic material. In a disclosed embodiment, the heat sink includes a central portion having greater thermal conductivity than a peripheral portion surrounding the central portion.

In some embodiments, the heat sink includes a unitary piece of material, which is shaped to define the base and the first and second platforms. Alternatively, the heat sink includes a first piece of heat sink material, which is shaped to define the base, and a second piece of heat sink material, which is mounted on the first piece of heat sink material and defines the second platform.

In a disclosed embodiment, the first and second monolithic emitter arrays respectively include first and second semiconductor substrates and first and second pluralities of vertical-cavity surface-emitting lasers (VCSELs) disposed respectively on the first and second semiconductor substrates.

In some embodiments, the heat sink is positioned relative to the optical element so that the first monolithic emitter array is located at a rear focal plane of the optical element, while the second monolithic emitter array is displaced axially from the rear focal plane. In one embodiment, the optical element is configured to focus the first optical beams so as to project patterned radiation onto the target region and to defocus the second optical beams so as to project flood radiation onto the target region. Alternatively, the optical element is configured to focus the first optical beams so as to project first patterned radiation onto the target region with a first focal quality and to defocus the second optical beams so as to project second patterned radiation onto the target region with a second focal quality, different from the first focal quality. In a disclosed embodiment, the first optical beams are projected toward the target region with a first divergence, and the second optical beams are projected toward the target region with a second divergence, greater than the first divergence.

There is also provided, in accordance with an embodiment of the invention, a method for depth mapping, which includes projecting a first pattern of radiation, with a first divergence, onto a target region and projecting a second pattern of radiation, with a second divergence, different from the first divergence, onto the target region. Respective first and second images are captured of the first and second patterns projected onto the target scene. Depth coordinates of points in the target region are computed responsively to respective displacements of the first and second patterns in the first and second images and to a defocus of the second pattern relative to the first pattern in the first and second images.

In a disclosed embodiment, projecting the first and second patterns includes applying an optical element to direct toward the target scene beams of the radiation that are emitted respectively by first and second emitter arrays, which are mounted at different locations relative to a rear focal plane of the optical element. Additionally or alternatively, the first and second patterns include spots of the radiation, and computing the depth coordinates includes comparing respective sizes of the spots in the first and second patterns in order to compute the defocus.

There is additionally provided, in accordance with an embodiment of the invention, a method for fabricating optoelectronic apparatus. The method includes shaping a heat sink to define a base, a first platform at a first elevation above the base, and a second platform alongside the first platform at a second elevation above the base, which is different from the first elevation. A first monolithic emitter array, which is configured to emit first optical beams, is mounted on the first platform, and a second monolithic emitter array, which is configured to emit second optical beams, is mounted on the second platform. An optical element is positioned to direct both the first and the second optical beams toward a target region.

The present invention will be more fully understood from the following detailed description of the embodiments thereof, taken together with the drawings in which:

DETAILED DESCRIPTION OF EMBODIMENTS

Overview

In embodiments of the present invention, radiation sources of different focal qualities are combined into a single optoelectronic apparatus comprising an optical element, such as a lens, and two monolithic emitter arrays, both of which emit optical beams through the optical element. One of the arrays is positioned at the rear focal plane of the optical element, while the other array is displaced from the rear focal plane, for example by axial shift of 100 µm or more. The beams emitted by the array at the rear focal plane are projected by the element as collimated beams, thus projecting patterned radiation on a target region in a pattern corresponding to the layout of the emitters in the array. The beams emitted by the array that is displaced from the rear focal plane are defocused. In the disclosed embodiments, the monolithic arrays comprise arrays of vertical-cavity surface-emitting lasers (VCSELs), disposed on semiconductor substrates, such as a gallium-arsenide (GaAs) substrate; but alternatively, other types of emitters may be used.

The position of the defocused array is chosen depending on the desired degree of defocus. In some embodiments, the defocus is sufficient so that the projected beams create a broad and largely uniform field of flood illumination. In an alternative embodiment, the defocus is chosen so that the beams projected from the defocused array also create patterned radiation. The apparatus thus projects two different patterns, with pattern elements (such as spots) whose sizes vary differently as a function of distance from the apparatus.

Positioning the two arrays precisely within the required range of distances from the optical element can be difficult. This difficulty is exacerbated by the need to sink away the substantial amount of heat that is generated by the emitters.

Embodiments of the present invention that are described herein address these problems by providing a heat sink, which is shaped to define two platforms at different elevations above the base of the heat sink. The two monolithic arrays of emitters are mounted respectively on the two platforms, thus positioning the two arrays at different elevations.

In the disclosed embodiments, mounting the two monolithic arrays on the two platforms provides the required differential focal distances (distances from the optical element) for the two arrays. The heat sink may be fabricated from a metal, such as copper (Cu) or copper-tungsten alloy (CuW), or from a ceramic material, such as aluminum nitride (AlN), or other suitable materials with a high thermal conductivity.

Thermal gradients of the VCSEL arrays may be compensated in the heat sink by fabricating it from a composite material, such as Cu/CuW, or by opening vias in the heat sink, as described, for example, in the above-mentioned U.S. Pat. No. 9,735,539.

System Description

Figure 1:
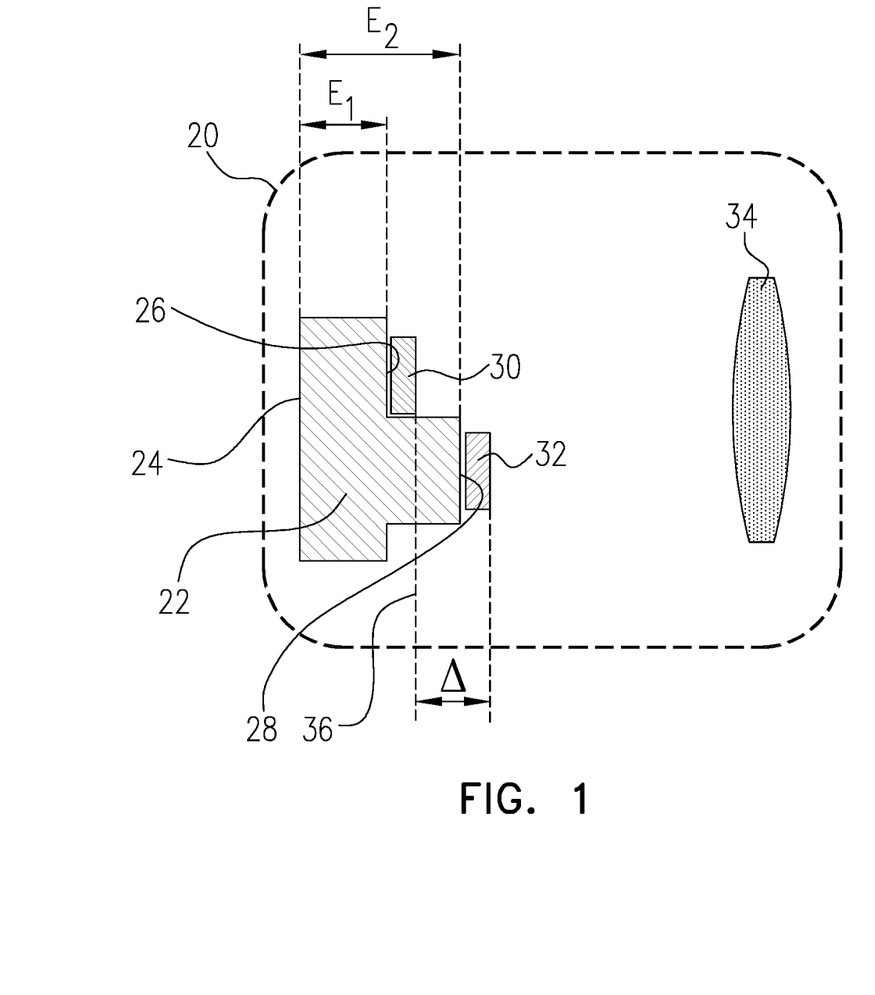
FIG. 1 is a schematic sectional view of an optoelectronic apparatus, in accordance with an embodiment of the invention.

FIG. 1 is a schematic sectional view of an optoelectronic apparatus 20, in accordance with an embodiment of the invention. Optoelectronic apparatus 20 comprises a heat sink 22 comprising a unitary piece of material, which is shaped to define a base 24 and first and second platforms 26 and 28, respectively, wherein the first platform is above the base by an elevation $E_1$, and the second platform is above the base by an elevation $E_2$, and wherein $E_1 \neq E_2$. Heat sink 22 may be fabricated from a metal, such as copper (Cu) or copper-tungsten alloy (CuW), or from a ceramic material, such as aluminum nitride (AlN), as these materials have a high thermal conductivity. VCSEL arrays 30 and 32 are mounted on respective platforms 26 and 28. Apparatus 20 further comprises an optical element 34 with a rear focal plane 36. Heat sink 22 is positioned relative to optical element 34 so that VCSEL array 30 is located at rear focal plane 36, while array 32 is displaced axially from the rear focal plane by a distance Δ. Typical values for Δ vary, depending on the focal length of optical element 34, for example from 50 µm to 500 µm, although Δ may also assume values outside this range.

Figure 2A:
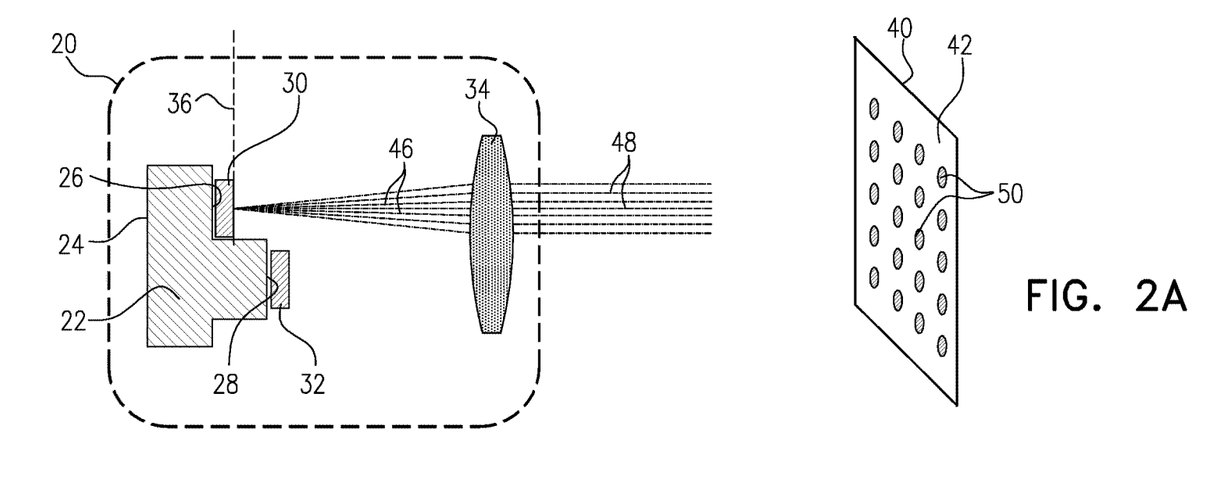
FIGS. 2a and 2b are schematic side views of optoelectronic apparatus illuminating a target region with patterned radiation and flood radiation, respectively, in accordance with an embodiment of the invention.
Figure 2B:
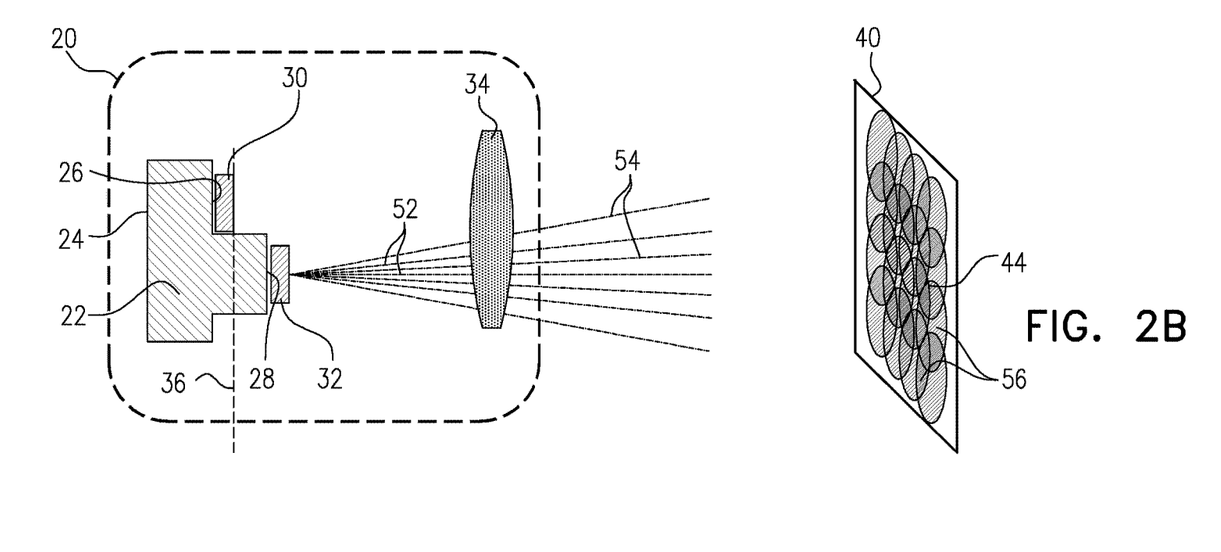

FIGS. 2a and 2b are schematic side views of optoelectronic apparatus 20 illuminating a target region respectively with patterned radiation 42 and flood radiation 44, in accordance with an embodiment of the invention. Where applicable, labels from FIG. 1 are used for similar items in FIGS. 2a and 2b.

In FIG. 2a, VCSEL array 30 is driven to emit first optical beams 46 towards optical element 34. As VCSEL array 30 is located at rear focal plane 36 of optical element 34, beams 46 are collimated and projected by the optical element towards target region 40 as collimated beams 48. Beams 48 illuminate target region 40 with patterned radiation 42, comprising discrete spots 50 of radiation (with the pattern shown in an enlarged scale), in a pattern determined, for example, by the layout of the VCSELs in array 30. Although spots 50 appear in the figures to be laid out in a regular pattern, it can be advantageous for purposes of depth mapping that the arrangement of the VCSELs in array 30, and hence of spots 50, be irregular, for example laid out in a pseudorandom pattern.

In FIG. 2b, VCSEL array 32 is driven to emit second optical beams 52 towards optical element 34. As VCSEL array 32 is displaced axially from rear focal plane 36, beams 52 are defocused and projected by the optical element towards target region 40 as diverging beams 54. Beams 54 illuminate target region 40 with flood radiation 44, comprising blurred, overlapping spots 56, resulting in a broad and substantially uniform illumination of the target region.

Figure 2C:
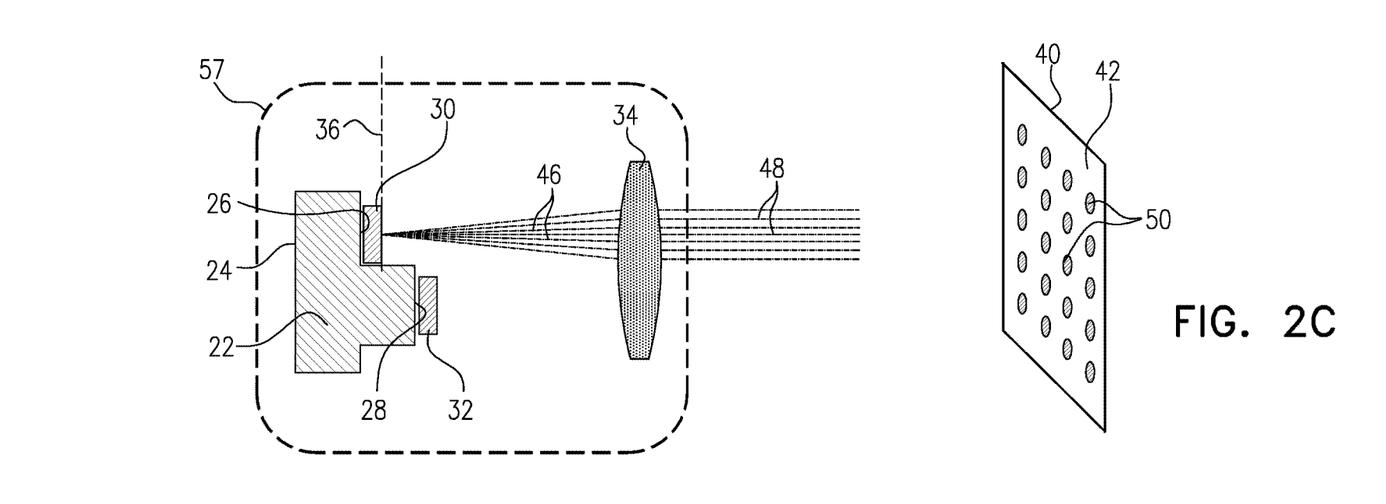
FIGS. 2c and 2d are schematic side views of optoelectronic apparatus illuminating a target region by patterned radiation with different focal properties, in accordance with an alternative embodiment of the invention.
Figure 2D:
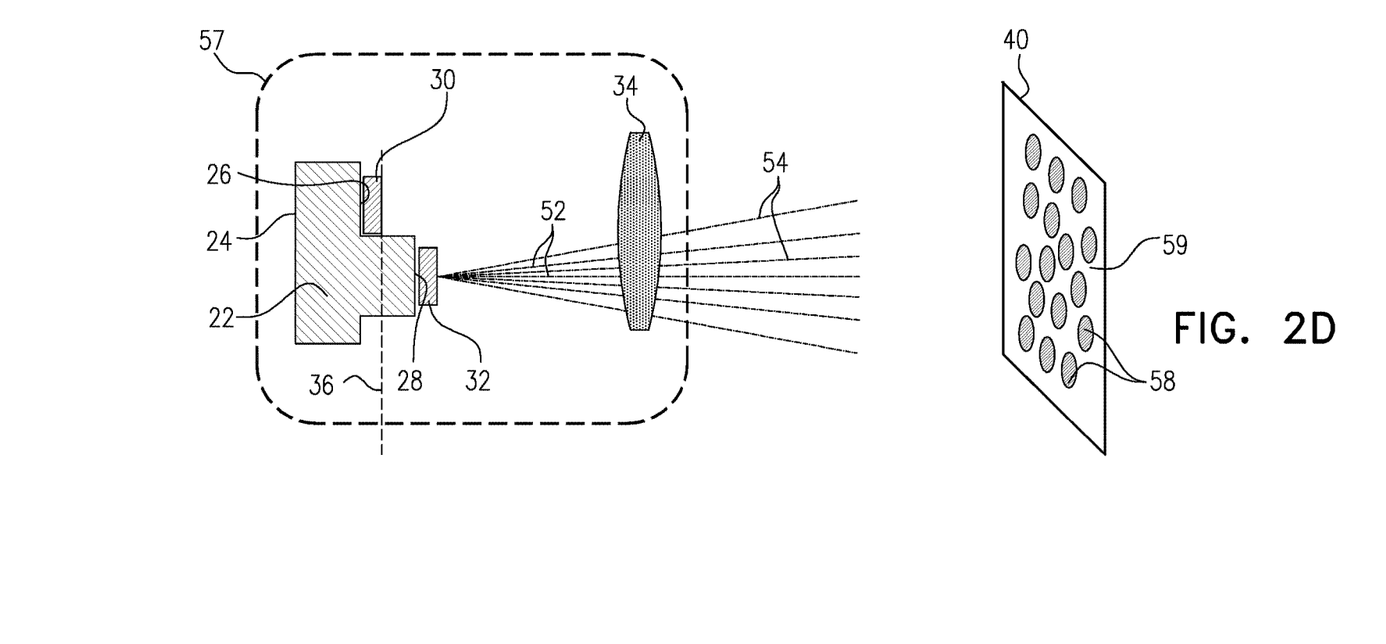

FIGS. 2c and 2d are schematic side views of optoelectronic apparatus 57 illuminating target region 40 respectively with patterned radiation 42 and 59 of different focal qualities, in accordance with an alternative embodiment of the invention. The components of apparatus 57 are similar to those of apparatus 20, and the same indicator numbers are used to refer to the same components in FIGS. 2c-d as in FIGS. 2a-b. In apparatus 57, however, the displacement of VCSEL array 32 from rear focal plane 36 is chosen so that beams 54 form distinct spots 58 on target region 40. Typically, in this embodiment the displacement of VCSEL array 32 from rear focal plane 36 is relatively smaller than in apparatus 20.

Due to the defocus of beams 52, spots 58 are typically larger than spots 50 and have larger divergence, i.e., spots 58 grow more rapidly as a function of distance from apparatus 57 than do spots 50. The difference in spot size and the divergence can be set by appropriate choice of the displacement of VCSEL array 32 from rear focal plane 36, as well as adjusting other optical parameters of apparatus 57. For example, in a miniaturized device of short focal length, displacement of VCSEL array 32 by as little as 20 μm from rear focal plane 36 can result in a difference of 50% in the far-field size of spots 58 relative to spots 50. The combination of two different patterns of radiation 42 and 59 with different divergences can be helpful in enhancing the accuracy of depth mapping using apparatus 57. This feature of the apparatus is described further hereinbelow with reference to FIG. 9.

Heat Sink Designs

Figure 3:
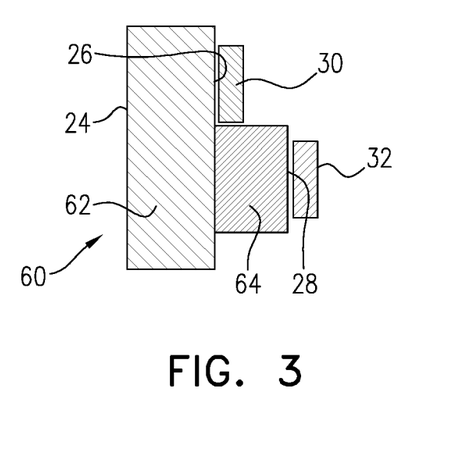
FIG. 3 is a schematic sectional view of a heat sink on which emitter arrays are mounted, in accordance with another embodiment of the invention.

FIG. 3 is a schematic sectional view of a heat sink 60, in accordance with another embodiment of the invention. Where applicable, labels from FIGS. 1-2 are used for similar items in FIG. 3.

Heat sink 60 is similar to heat sink 22 in FIGS. 1-2, but whereas heat sink 22 comprises a unitary piece, heat sink 60 comprises a first piece 62 of heat sink material, which is shaped to define base 24 and first platform 26, and a second piece 64 of heat sink material, which is mounted on the first piece and defines second platform 28. First and second pieces 62 and 64 may be fabricated from the same material, as described above, or from two different materials. For example, first piece 62 may be fabricated from AlN, and second piece 64 may be fabricated from Cu.

Figure 4:
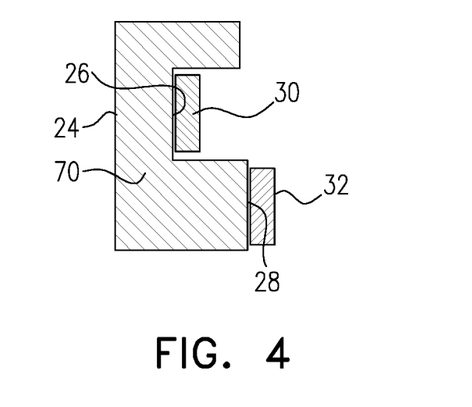
FIG. 4 is a schematic sectional view of a heat sink on which emitter arrays are mounted, in accordance with yet another embodiment of the invention.

FIG. 4 is a schematic sectional view of a heat sink 70, in accordance with yet another embodiment of the invention. Where applicable, labels from FIGS. 1-2 are used for similar items in FIG. 4. Heat sink 70 is similar to heat sink 22, but whereas in heat sink 22 second platform 28 is built up above base 24, in heat sink 70 first platform 26 is contained within a cavity, which may be machined or etched down into the material of the heat sink, for example.

Figure 5:
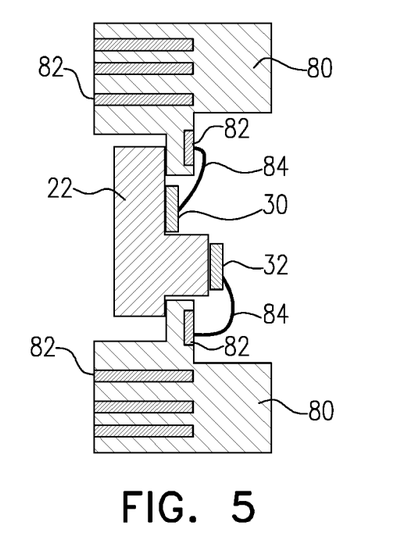
FIG. 5 is a schematic sectional view of a heat sink and emitter arrays mounted on a ceramic mount, in accordance with an embodiment of the invention.

FIG. 5 is a schematic sectional view of heat sink 22 and VCSEL arrays 30 and 32 (FIG. 1) mounted on a ceramic mount 80, in accordance with an embodiment of the invention. Where applicable, labels from FIGS. 1-2 are used for similar items in FIG. 5. Heat sink 22 is mounted on ceramic mount and attached to it by, for example, suitable cement. Ceramic mount 80 comprises electrical conductors 82, fabricated for example from gold (Au). VCSEL arrays 30 and 32 are coupled to conductors 82 by wire bonds 84.

Figure 6:
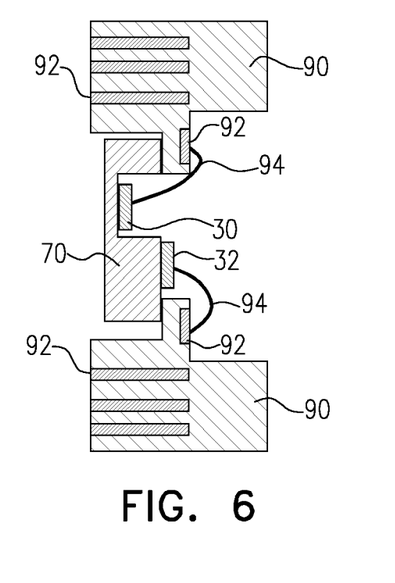
FIG. 6 is a schematic sectional view of a heat sink and emitter arrays mounted on a ceramic mount, in accordance with another embodiment of the invention.

FIG. 6 is a schematic sectional view of heat sink 70 (FIG. 4) and VCSEL arrays 30 and 32 mounted on a ceramic mount 90, in accordance with another embodiment of the invention. Where applicable, labels from FIGS. 1-4 are used for similar items in FIG. 6. Similarly to FIG. 5, heat sink 70 is mounted on ceramic mount 90 and attached to it by, for example, suitable cement. Ceramic mount 90 comprises, similarly to ceramic mount 80, electrical conductors 92 fabricated from Au. VCSEL arrays 30 and 32 are coupled to conductors 92 by wire bonds 94.

Figure 7A:
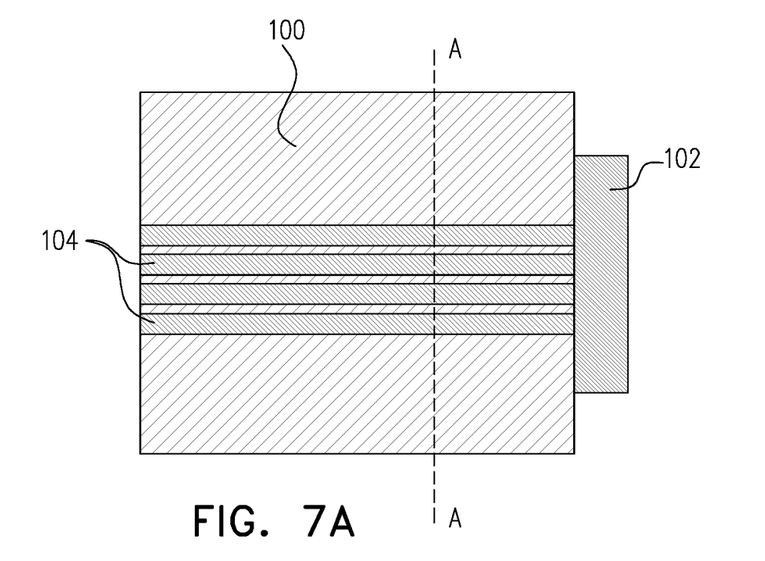
FIGS. 7a and 7b are schematic sectional views of a heat sink, in accordance with an embodiment of the invention.
Figure 7B:
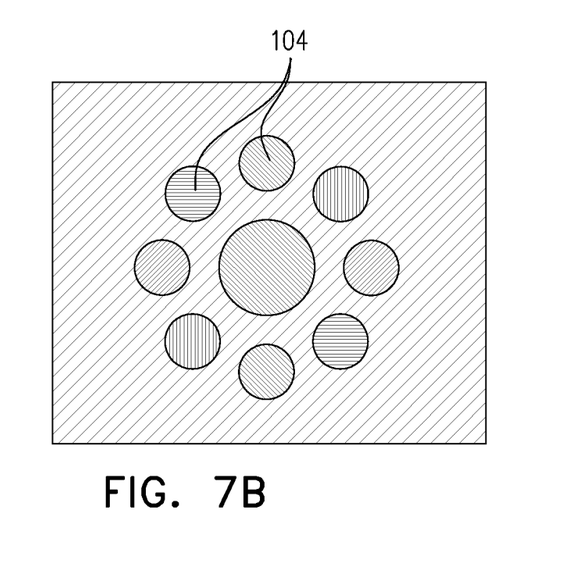

FIGS. 7a and 7b are schematic sectional views of a heat sink 100, in accordance with an embodiment of the invention. The features of heat sink 100 may be incorporated in heat sink 22 or in the other heat sinks described above.

In FIG. 7a, a VCSEL array 102 is mounted on heat sink 100, and together they form a part of an optoelectronic apparatus similar to apparatus 20. For example, heat sink 100 and VCSEL array 102 may replace second piece 64 and VCSEL array 32 in FIG. 3. Heat sink 100 is fabricated from a metal or a ceramic material, similarly to heat sink (FIG. 1).

Heat sink 100 comprises vias 104, which are configured to modify the thermal conductivity of the heat sink so as to compensate for thermal gradients of VCSEL array 102. Specifically, the VCSELs in the central region of array 102 tend to operate under a heavier heat load than those in the peripheral regions, due to heat dissipation from neighboring VCSELs. Vias 104 are useful in sinking heat preferentially away from the central region, so that operating temperatures are roughly equalized.

FIG. 7b is a schematic sectional view of heat sink 100 along a section A-A of FIG. 7a. Vias 104 are arranged in a concentric configuration, with a central via of greater diameter than the peripheral vias, thus aiding in compensating for thermal gradients of VCSEL array 102. The arrangement and dimensions of vias 104 may be modified in order to accommodate different designs and thermal gradients of VCSEL array 102.

Figure 8A:
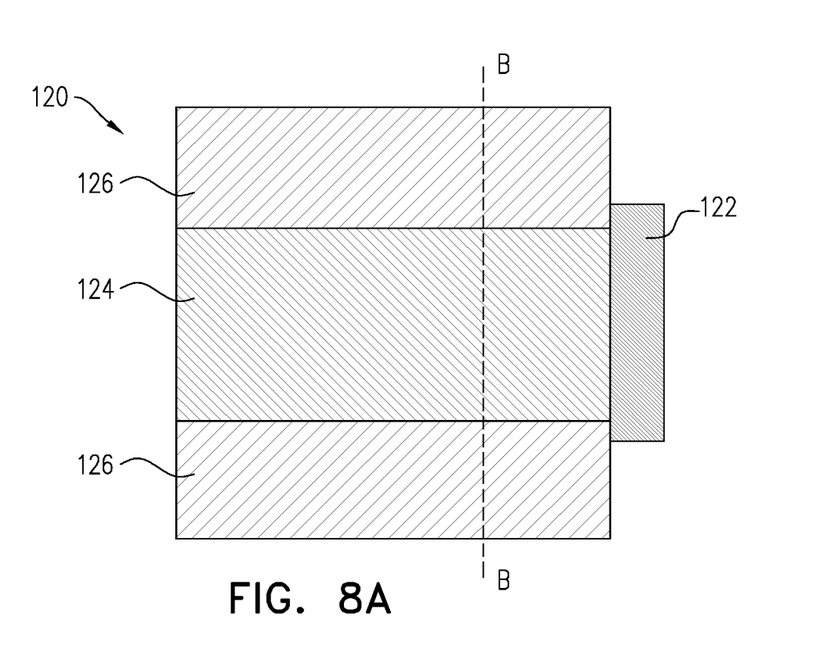
FIGS. 8a and 8b are schematic sectional views of a heat sink, in accordance with another embodiment of the invention.
Figure 8B:
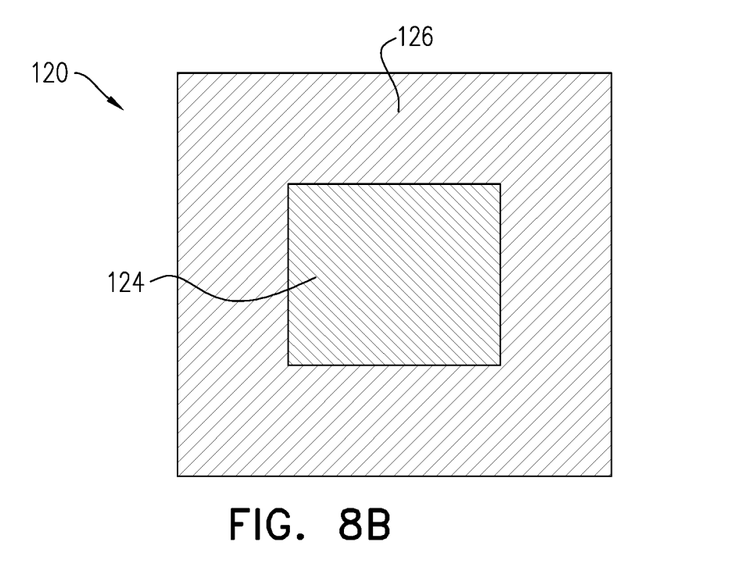

FIGS. 8a and 8b are schematic sectional views of a heat sink 120, in accordance with another embodiment of the invention. In this case, too, the features of heat sink 120 can be incorporated in heat sink 22 or in the other heat sinks described above.

In FIG. 8a, a VCSEL array 122 is mounted on heat sink 120, and together they form a part of an optoelectronic apparatus similar to apparatus 20. For example, heat sink 120 and VCSEL array 122 may replace second piece 64 and VCSEL array 32 in FIG. 3. Heat sink 120 is fabricated as a composite material comprising a central Cu-core 124 and a CuW-mantle 126, wherein the core has a higher thermal conductivity than the mantle, thus compensating for thermal gradients of VCSEL array 122.

FIG. 8b is a schematic sectional view of heat sink 120 along a section B-B of FIG. 8a. The arrangement, dimensions, and materials of core 124 and mantle 126 may be modified in order to accommodate different designs and thermal gradients of VCSEL array 122.

Depth Mapping Using Dual Structured Light Patterns

Figure 9:
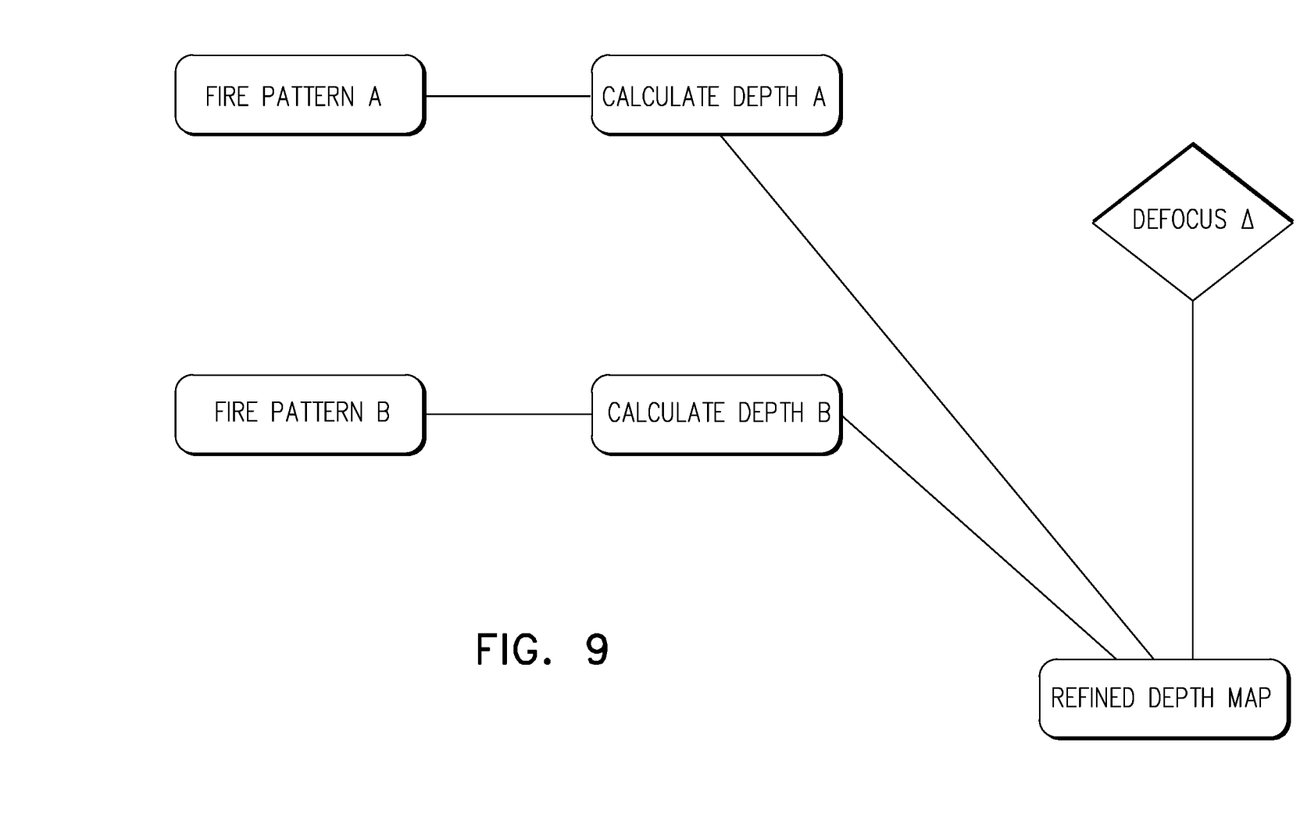
FIG. 9 is a flow chart that schematically illustrates a method for depth mapping using patterned radiation of different focal qualities, in accordance with an embodiment of the invention.

FIG. 9 is a flow chart that schematically illustrates a method for depth mapping using radiation patterns of different focal qualities, in accordance with an embodiment of the invention. This method is described hereinbelow, for the sake of clarity and concreteness, specifically with reference to patterned radiation 42 and 59, as shown in FIGS. 2c-d. The principles of this embodiment may alternatively be applied using other sorts of pattern projectors with suitable capabilities. The description that follows assumes that an image capture assembly (not shown in the figures) captures images of the patterns of spots 50 and 58 that are projected onto target region 40, from a location that is offset relative to apparatus 57 that projects the patterned radiation, as is known in the art of depth mapping using structured light. An arrangement of this sort, in which both the spot locations and shape characteristics are detected by an image capture assembly and analyzed by a processor in order to create a 3D map (also referred to as a depth map), is described, for example, in U.S. Pat. No. 8,050,461, whose disclosure is incorporated herein by reference.

Apparatus 57 is actuated to project patterned radiation 42 in alternation with patterned radiation 59, by applying drive currents to the corresponding VCSEL arrays 30 and 32. Patterned radiation 42 and 59 respectively define different patterns on target region 40, referred to in FIG. 9 as "pattern A" and "pattern B." The image capture assembly captures images of both patterns. The processor compares the locations of spots 50 and 58 in the images to corresponding reference patterns of the spots, and calculates two sets of depth coordinates (shown in FIG. 9 as "depth A" and "depth B") of points in the target region based on the displacement between the spots in the images and their reference locations. The use of two different patterns thus enables the processor to find the depth coordinates with improved spatial resolution, relative to the resolution achievable using only a single projected pattern.

The processor can improve the depth resolution still further by computing and applying the relative defocus A of spots 58 relative to spots 50. For this purpose, the processor may extract and use either the absolute sizes of spots 50 and 58 or the relative sizes, or both absolute and relative sizes, in estimating the distance to each spot in the images based on the different, known divergences of beams 48 and 54. The defocus gives an additional, independent measure of depth, which can be used to refine and resolve ambiguities in the displacement-based depth coordinates depth A and depth B.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic apparatus, comprising:
    a heat sink, which is shaped to define a base, a first platform at a first elevation above the base, and a second platform alongside the first platform at a second elevation above the base, which is different from the first elevation;
    a first monolithic emitter array, which is mounted on the first platform and is configured to emit first optical beams;
    a second monolithic emitter array, which is mounted on the second platform and is configured to emit second optical beams; and
    an optical element, which is positioned relative to the heat sink so that the first monolithic emitter array is located at a rear focal plane of the optical element, while the second monolithic emitter array is displaced axially from the rear focal plane and is configured to direct both the first and the second optical beams with different divergences toward a target region.

2. The optoelectronic apparatus according to claim 1, wherein the heat sink comprises a metal.

3. The optoelectronic apparatus according to claim 1, wherein the heat sink comprises a ceramic material.

4. The optoelectronic apparatus according to claim 1, wherein the heat sink comprises a central portion having greater thermal conductivity than a peripheral portion surrounding the central portion.

5. The optoelectronic apparatus according to claim 1, wherein the heat sink comprises a unitary piece of material, which is shaped to define the base and the first and second platforms.

6. The optoelectronic apparatus according to claim 1, wherein the heat sink comprises a first piece of heat sink material, which is shaped to define the base, and a second piece of heat sink material, which is mounted on the first piece of heat sink material and defines the second platform.

7. The optoelectronic apparatus according to claim 1, wherein the first and second monolithic emitter arrays respectively comprise first and second semiconductor substrates and first and second pluralities of vertical-cavity surface-emitting lasers (VCSELs) disposed respectively on the first and second semiconductor substrates.

8. The optoelectronic apparatus according to claim 1, wherein the optical element is configured to focus the first optical beams so as to project patterned radiation onto the target region and to defocus the second optical beams so as to project flood radiation onto the target region.

9. The optoelectronic apparatus according to claim 1, wherein the optical element is configured to focus the first optical beams so as to project first patterned radiation onto the target region with a first focal quality and to defocus the second optical beams so as to project second patterned radiation onto the target region with a second focal quality, different from the first focal quality.

10. The optoelectronic apparatus according to claim 9, wherein the first optical beams are projected toward the target region with a first divergence, and the second optical beams are projected toward the target region with a second divergence, greater than the first divergence.

11. A method for depth mapping, comprising:
    projecting a first pattern of radiation, with a first divergence, onto a target region;

projecting a second pattern of radiation, with a second divergence, different from the first divergence, onto the target region;

capturing respective first and second images of the first and second patterns projected onto the target region; and computing depth coordinates of points in the target region responsively to respective displacements of the first and second patterns in the first and second images and to a defocus of the second pattern relative to the first pattern in the first and second images.

12. The method according to claim 11, wherein projecting the first and second patterns comprises applying an optical element to direct toward the target region beams of the radiation that are emitted respectively by first and second emitter arrays, which are mounted at different locations relative to a rear focal plane of the optical element.

13. The method according to claim 11, wherein the first and second patterns comprise spots of the radiation, and wherein computing the depth coordinates comprises comparing respective sizes of the spots in the first and second patterns in order to compute the defocus.

14. A method for fabricating optoelectronic apparatus, comprising:

shaping a heat sink to define a base, a first platform at a first elevation above the base, and a second platform alongside the first platform at a second elevation above the base, which is different from the first elevation;

mounting a first monolithic emitter array, which is configured to emit first optical beams, on the first platform;

mounting a second monolithic emitter array, which is configured to emit second optical beams, on the second platform; and positioning an optical element relative to the heat sink so that the first monolithic emitter array is located at a rear focal plane of the optical element, while the second monolithic emitter array is displaced axially from the rear focal plane, so as to direct both the first and the second optical beams with different divergences toward a target region.

15. The method according to claim 14, wherein the heat sink comprises a central portion having greater thermal conductivity than a peripheral portion surrounding the central portion.

16. The method according to claim 14, wherein the first and second monolithic emitter arrays respectively comprise first and second semiconductor substrates and first and second pluralities of vertical-cavity surface-emitting lasers (VCSELs) disposed respectively on the first and second semiconductor substrates.

17. The method according to claim 14, wherein the optical element is configured to focus the first optical beams so as to project patterned radiation onto the target region and to defocus the second optical beams so as to project flood radiation onto the target region.

18. The method according to claim 14, wherein the optical element is configured to focus the first optical beams so as to project first patterned radiation onto the target region with a first focal quality and to defocus the second optical beams so as to project second patterned radiation onto the target region with a second focal quality, different from the first focal quality.

* * * * *